(12) United States Patent
Gong et al.

(10) Patent No.: US 11,665,983 B2
(45) Date of Patent: May 30, 2023

(54) PHASE CHANGE MEMORY CELL WITH OVONIC THRESHOLD SWITCH

(71) Applicant: INTERNATIONAL BUSINESS MACHINES CORPORATION, Armonk, NY (US)

(72) Inventors: Nanbo Gong, White Plains, NY (US); Takashi Ando, Eastchester, NY (US); Robert L. Bruce, White Plains, NY (US); Alexander Reznicek, Troy, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 17/118,664

(22) Filed: Dec. 11, 2020

(65) Prior Publication Data

US 2022/0190238 A1    Jun. 16, 2022

(51) Int. Cl.
*H10N 70/20* (2023.01)
*H10N 70/00* (2023.01)

(52) U.S. Cl.
CPC ......... *H10N 70/231* (2023.02); *H10N 70/021* (2023.02); *H10N 70/8265* (2023.02); *H10N 70/841* (2023.02)

(58) Field of Classification Search
CPC ....................................................... H01L 45/06
See application file for complete search history.

(56) References Cited

U.S. PATENT DOCUMENTS

| | | | |
|---|---|---|---|
| 7,687,830 B2 | 3/2010 | Pellizzer | |
| 8,385,100 B2 | 2/2013 | Kau | |

(Continued)

FOREIGN PATENT DOCUMENTS

| | | |
|---|---|---|
| CN | 107611259 A | 1/2018 |
| CN | 110610958 A | 12/2019 |
| CN | 111584411 A | 8/2020 |

OTHER PUBLICATIONS

Notification of Transmittal of the International Search Report and the Written Opinion of the International Searching Authority, or the Declaration, dated Jan. 26, 2022, Applicant's or agent's file reference PF210872PCT, International application No. PCT/CN2021/129789, 12 pages.

(Continued)

*Primary Examiner* — Mounir S Amer
(74) *Attorney, Agent, or Firm* — L. Jeffrey Kelly

(57) ABSTRACT

A structure including a bottom electrode, a phase change material layer vertically aligned and an ovonic threshold switching layer vertically aligned above the phase change material layer. A structure including a bottom electrode, a phase change material layer and an ovonic threshold switching layer vertically aligned above the phase change material layer, and a first barrier layer physically separating the ovonic threshold switching layer from a top electrode. A method including forming a structure including a liner vertically aligned above a first barrier layer, the first barrier layer vertically aligned above a phase change material layer, the phase change material layer vertically aligned above a bottom electrode, forming a dielectric surrounding the structure, and forming an ovonic threshold switching layer on the first barrier layer, vertical side surfaces of the first buffer layer are vertically aligned with the first buffer layer, the phase change material layer and the bottom electrode.

18 Claims, 6 Drawing Sheets

(56) References Cited

U.S. PATENT DOCUMENTS

| | | | |
|---|---|---|---|
| 9,437,293 B1 | 9/2016 | Kripanidhi | |
| 9,659,998 B1* | 5/2017 | Lung | H01L 23/528 |
| 9,793,323 B1 | 10/2017 | Lung | |
| 10,157,671 B1 | 12/2018 | Lung | |
| 10,192,616 B2 | 1/2019 | O'Toole | |
| 10,255,953 B2 | 4/2019 | O'Toole | |
| 10,482,954 B2 | 11/2019 | Pellizzer | |
| 2015/0287458 A1 | 10/2015 | Pellizzer | |
| 2019/0097129 A1 | 3/2019 | Liu | |
| 2019/0386213 A1 | 12/2019 | Lai | |
| 2020/0005863 A1* | 1/2020 | Grobis | H01L 45/1675 |
| 2020/0066987 A1 | 2/2020 | Sims | |
| 2020/0295083 A1 | 9/2020 | Cheng | |
| 2022/0020817 A1* | 1/2022 | Yang | H01L 27/2481 |

OTHER PUBLICATIONS

Pending Application No. CN2021/129789, Filed on Nov. 10, 2021, entitled: "Phase Change Memory Cell With Ovonic Threshold Switch", P202000407PCT01, 25 pages.

Chien et al., "A Study on OTS-PCM Pillar Cell for 3-D Stackable Memory," IEEE Transactions on Electron Devices, vol. 65, No. 11, Nov. 2018, pp. 5172-5179.

Noé et al., "Toward ultimate nonvolatile resistive memories: The mechanism behind ovonic threshold switching revealed," Science Advances, vol. 6, Feb. 28, 2020, 12 pages.

Yeh et al., "High Endurance Self-Heating OTS-PCM Pillar Cell for 3D Stackable Memory" 2018 Symposium on VLSI Technology Digest of Technical Papers, pp. 205-206.

Pending U.S. Appl. No. 16/515,094, filed Jul. 18, 2019, entitled: "Phase Change Memory Cell With Second Conductive Layer", 26 pages.

* cited by examiner

PHASE CHANGE MEMORY CELL WITH
OVONIC THRESHOLD SWITCH

BACKGROUND

The present invention relates generally to a phase change memory cell, and more particularly, to a phase change memory cell with an ovonic threshold switch.

A phase change memory cell may be used for data storage. The phase change memory cell is a non-volatile random-access memory. A typical configuration of a phase change memory cell may include a phase change material arranged between, and coupled to, at least two electrodes. When the phase change memory cell is in use, the phase change material may be operated in one of at least two reversibly transformable phases, an amorphous phase and a crystalline phase. The amorphous phase and the crystalline phase are distinct from one another. In the amorphous phase, the phase change material has a discernibly higher resistance when compared to the crystalline phase. In order to facilitate a phase transition, energy is supplied to the phase change material such as, for example, electrical energy, thermal energy, any other suitable form of energy or combination thereof that may effectuate a desired phase transition.

A switching device, for example an ovonic threshold switch, may be used to select an individual memory element in an array of memory elements. An ovonic threshold switch is a glass switch which, after being brought from the highly resistive state to the conducting state, returns to the highly resistive state when current falls below a holding current value.

SUMMARY

According to an embodiment of the present invention, a structure is provided. The structure may include a bottom electrode on a substrate, a phase change material layer, the phase change material layer vertically aligned above the bottom electrode and an ovonic threshold switching layer vertically aligned above the phase change material layer.

According to an embodiment of the present invention, a structure is provided. The structure may include a bottom electrode on a substrate, a phase change material layer, the phase change material layer vertically aligned above the bottom electrode, an ovonic threshold switching layer vertically aligned above the phase change material layer, and a first barrier layer physically separating the ovonic threshold switching layer from a top electrode.

According to an embodiment of the present invention, a method is provided. The method may include forming a structure, the structure including a liner vertically aligned above a first barrier layer, the first barrier layer vertically aligned above a phase change material layer, the phase change material layer vertically aligned above a bottom electrode on a substrate, forming a dielectric surrounding the structure, and forming an ovonic threshold switching layer on the first barrier layer, where vertical side surfaces of the first buffer layer are vertically aligned with the first buffer layer, the phase change material layer and the bottom electrode.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
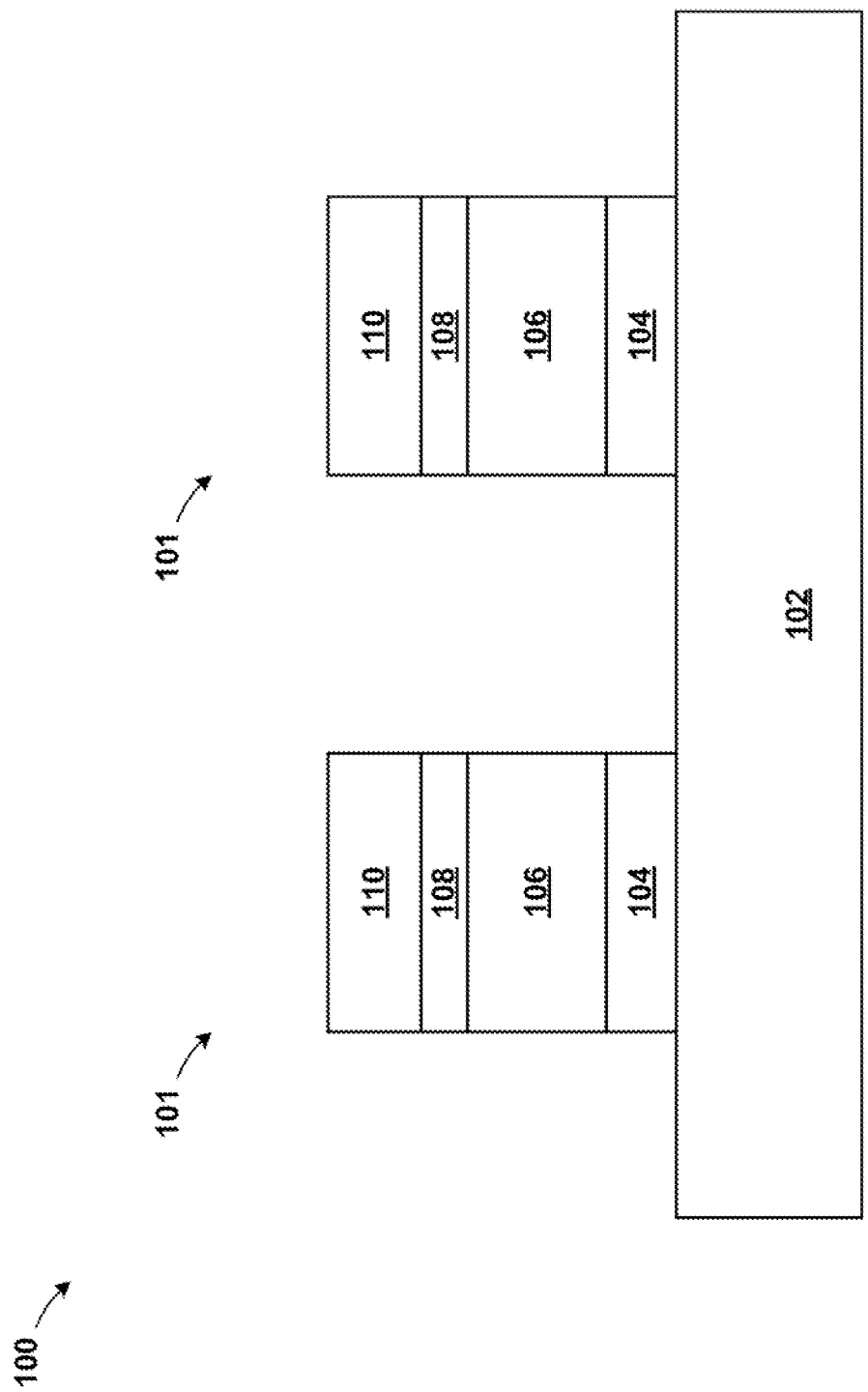
FIG. 1 illustrates a cross-sectional view of a semiconductor structure at an intermediate stage of fabrication, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention generally relate to a phase change memory cell, and more particularly, to a phase change memory cell with an ovonic threshold switch.

Vertically integrating a phase change memory cell with an ovonic threshold switch can produce higher density cross point arrays which may be used for storage class memory applications; however, doing so requires special processing to prevent etch damage to the materials used to form the ovonic threshold switch. In particular, embodiments of the present invention propose forming the ovonic threshold switch directly on top of the phase change memory cell in a pillar configuration and using additional buffer layers to prevent damage to the ovonic threshold switch materials caused by typical etching techniques. A method of forming a phase change memory cell with an ovonic threshold switch is described in detail below by referring to the accompanying drawings in FIGS. 1-6, in accordance with an illustrative embodiment.

Referring now to FIG. 1, a structure 100 is shown at an intermediate step of fabrication, according to an embodiment. The structure 100 may include a stack of layers formed on top of a substrate 102 and subsequently patterned into individual cells 101. Each cell 101 includes, for example, a bottom electrode 104, a phase change material layer 106, a first buffer layer 108, and a sacrificial layer 110.

The substrate 102 may be a silicon substrate with connections and structures, such as, for example, transistors and isolations built on it. The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick.

The bottom electrode 104 may be blanket deposited on top of the structure 100, and directly on a top surface of the substrate 102. The bottom electrode 104 may be formed from a conductive material layer, such as, for example, copper, tungsten, cobalt, or aluminum. The conductive material layer may be deposited using typical deposition techniques, for example, atomic layer deposition, molecular layer deposition, and chemical vapor deposition. In some cases, the conductive material layer of the bottom electrode 104 is deposited within a trench formed in the substrate 102. In an embodiment, the bottom electrode 104 may have a thickness ranging from about 10 nm to about 100 nm, although a thickness less than 10 nm and greater than 100 nm may be acceptable.

The phase change material layer 106 may be blanket deposited on top of the structure 100, and directly on a top surface of the conductive material layer of the bottom electrode 104. Conventional deposition processes, such as electroplating, electroless plating, chemical vapor deposition, physical vapor deposition, or a combination of methods, can be used to deposit the phase change material layer 106 on the bottom electrode 104. According to embodiments of the present invention, the phase change material layer 106 may be formed from a mixture of gallium (Ga) and antimony (Sb) and at least one of tellurium (Te), silicon (Si), germanium (Ge), arsenic (As), selenium (Se), indium (In), tin (Sn), bismuth (Bi), silver (Ag), gold (Au), and antimony (Sb). It is to be appreciated that the preceding list is merely illustrative and, thus, other elements can also be used to form the phase change material layer 106, while maintaining the spirit of the present principles disclosed herein. In an embodiment, the phase change material layer 106 may be made of a chalcogenide alloy such as germanium-antimony-tellurium (GST). According to another embodiment, the phase change material layer 106 may also be made of a transition metal oxide having multiple resistance states. For example, the phase change material layer 106 may be made of at least one material selected from the group consisting of NiO, $TiO_2$, HfO, $Nb_2O_5$, ZnO, $WO_3$, and CoO or GST ($Ge_2Sb_2Te_5$) or PCMO ($PrxCa1-xMnO_3$). In yet another embodiment, the phase change material may be a chemical compound including one or more elements selected from the group consisting of sulfur (S), selenium (Se), tellurium (Te), arsenic (As), antimony (Sb), germanium (Ge), tin (Sn), indium (In), and silver (Ag). In an embodiment, the phase change material layer 106 may have a thickness ranging from about 10 nm to about 100 nm, although a thickness less than 10 nm and greater than 100 nm may be acceptable.

The first buffer layer 108 may be blanket deposited on top of the phase change material layer 106. The first buffer layer 108 may include any suitable barrier material known in the art, such as titanium nitride (TiN), tantalum nitride (TaN), cobalt, ruthenium, carbon (C), titanium carbide (TiC), tantalum carbide (TaC), titanium aluminium nitride (TiAlN), tantalum aluminium nitride (TaAlN), titanium aluminium carbide (TiAlC), tantalum aluminium carbon (TaAlC), hafnium nitride (HfN) or tungsten nitride (WN) either alone or in combination with other suitable barrier material.

According to the present embodiment, the first buffer layer 108 acts as a barrier, physically separating the phase change material layer 106 from subsequent layers formed thereon. In an embodiment, the first buffer layer 108 may have a thickness ranging from about 1 nm to about 30 nm, although a thickness less than 1 nm and greater than 30 nm may be acceptable.

The sacrificial layer 110 may be blanket deposited on the structure 100, according to an exemplary embodiment. The sacrificial layer 110 may be deposited on the first buffer layer 108. The sacrificial layer 110 may be deposited using typical deposition techniques, for example, atomic layer deposition (ALD), molecular layer deposition (MLD), chemical vapor deposition (CVD), physical vapor deposition (PVD), and spin on techniques. The material of the sacrificial layer 110 may include silicon nitride, amorphous silicon, silicon oxynitride, boron nitride, silicon oxide, or any combination of these materials. In a preferred embodiment, the sacrificial layer 110 may include amorphous silicon because it can be easily removed selective to surrounding materials. In an embodiment, the sacrificial layer 110 may have a thickness ranging from about 10 nm to about 100 nm, although a thickness less than 10 nm and greater than 100 nm may be acceptable.

After the aforementioned layers and materials are formed or deposited, they are patterned into the individual cells 101, as depicted. The individual cells 101 can be formed using patterning techniques known in the art. More specifically, portions of the conductive material layer of the bottom electrode 104, the phase change material layer 106, the first buffer layer 108 and the sacrificial layer 110 may be selectively removed using an anisotropic etching technique, such as, for example, reactive ion etching. The cell 101 may include vertically aligned portions of the bottom electrode 104, the phase change material layer 106, the first buffer layer 108 and the sacrificial layer 110. Preferably, an upper surface of the substrate 102 is exposed as a result of patterning the aforementioned layers. In general, the size of the individual cells 101 will mimic existing phase change memory pillar cells and be similarly limited based on the function of a phase change memory pillar cell. For example, a typical phase change memory pillar cell may have a lateral width or diameter ranging from about 10 nm to about 200 nm.

Although only two individual cells 101 are shown, it should be noted that the structure 100 would typically include an array of several thousand cells all formed according the methods disclosed herein.

Figure 2:
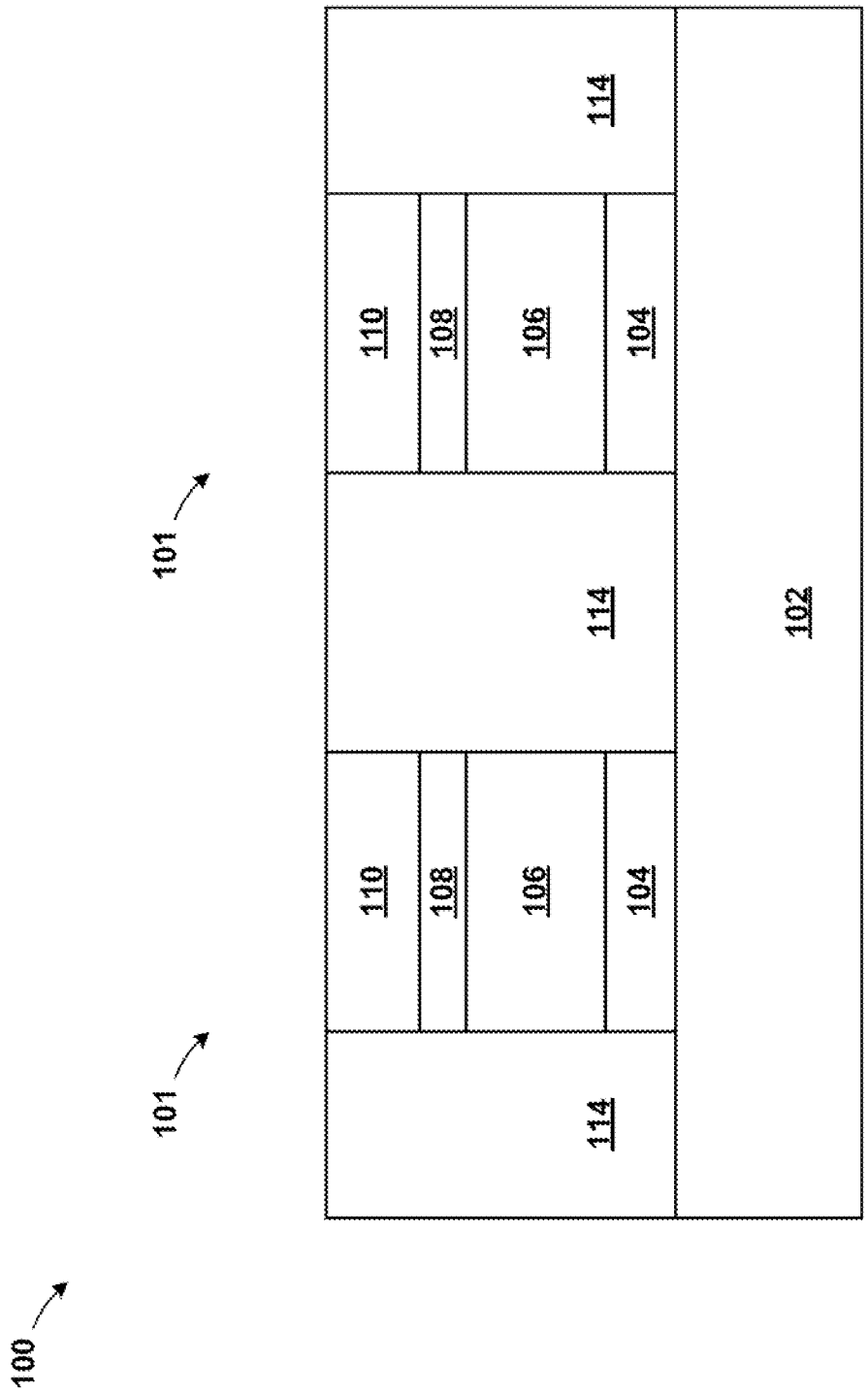
FIG. 2 illustrates a cross-sectional view of the semiconductor structure illustrating depositing a dielectric layer, according to an exemplary embodiment.

Referring now to FIG. 2, the structure 100 is shown after depositing a first dielectric layer 114, commonly referred to as an inter-layer dielectric layer, in accordance with an embodiment. The first dielectric layer 114 can be deposited across the top of the structure 100 in a blanket layer using any known deposition techniques, such as, for example, chemical vapor deposition, atomic layer deposition, physical layer deposition, or some combination thereof. More specifically, the first dielectric layer 114 may be deposited within and generally fill the spaces between adjacent cells 101. The first dielectric layer 114 may include materials, such as, for example, an oxide, a nitride, or some combination thereof. In an embodiment, the first dielectric layer 114 may include an oxide, such as, silicon oxide. In an alternate embodiment, the first dielectric layer 114 may include a nitride, such as, silicon nitride. A chemical mechanical planarization technique may optionally be used to polish the first dielectric layer 114, expose the sacrificial layer 110 and provide a substantially smooth and uniform surface in preparation for subsequent processing techniques.

Figure 3:
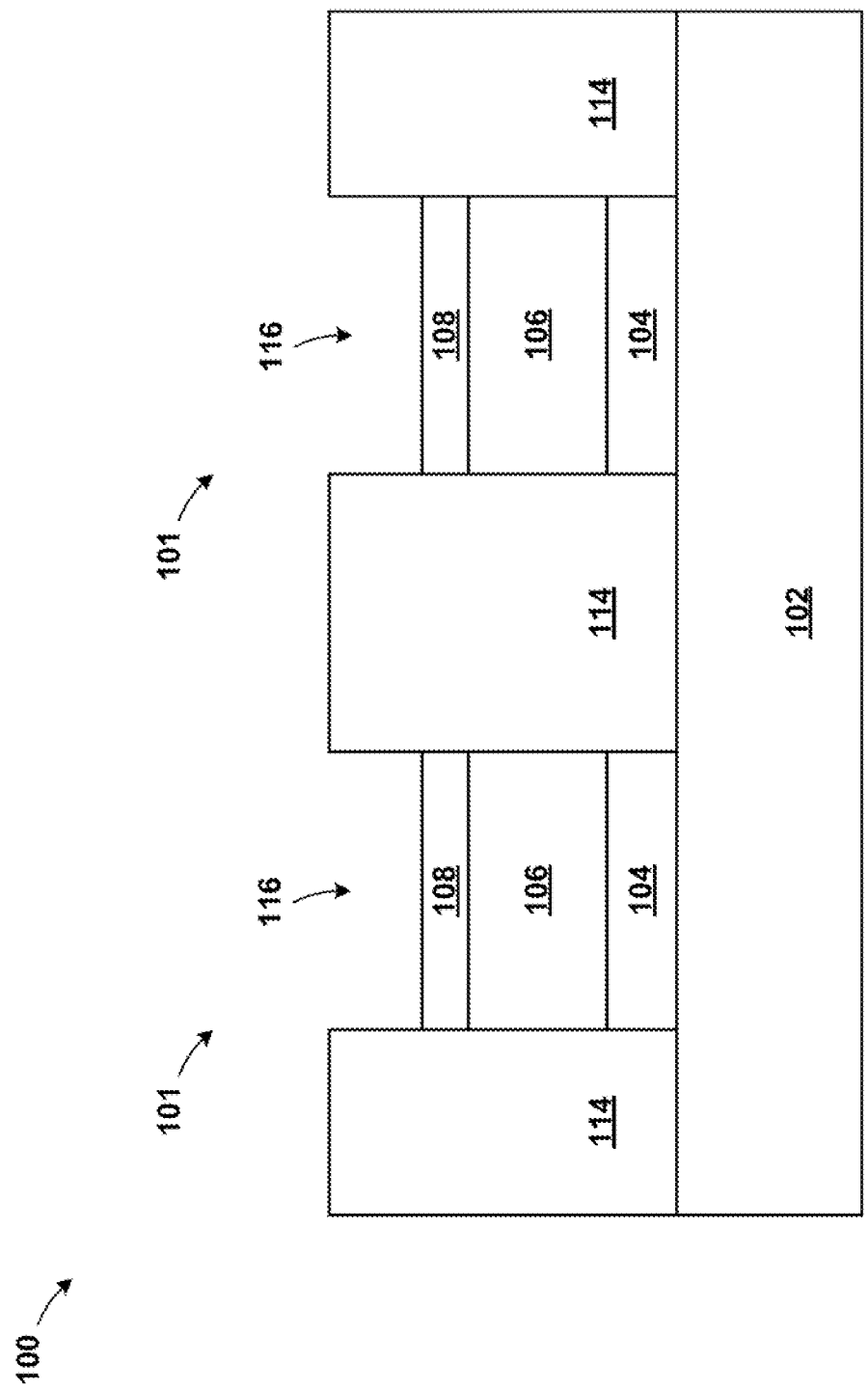
FIG. 3 illustrates a cross-sectional view the semiconductor structure illustrating removing a sacrificial layer, according to an exemplary embodiment.

Referring now to FIG. 3, the structure 100 is shown after removing the sacrificial layer 110 to form an opening 116, in accordance with an embodiment. The selective removal of the sacrificial layer 110 may be performed in one or more steps, including for example, forming a patterning layer on the structure 100, selective removal of the sacrificial layer 110 using an anisotropic etching technique, such as, for example, reactive ion etching (RIE), and selective removal of the patterning layer. Preferably, the sacrificial layer 110 is completely removed selective to, or without removing substantial portions of, the first dielectric layer 114 or the first buffer layer 108. As such, an upper surface of the first buffer layer 108 is exposed.

As noted above, the sacrificial layer 110 may be made from any common sacrificial material capable of being easily removed selective to a chosen material of the first dielectric layer 114 and a chosen material of the first buffer layer 108. In this case, the first buffer layer 108 functions as a protective layer and prevents damage to the phase change material layer 106 during removal of the sacrificial layer 110. The sacrificial layer 110 allows for the patterning or etching, used to define the individual cells 101 prior to forming, or otherwise integrating, any switch or switching materials into the structure, as is described in detail below. Doing so prevents any damage to the switch or switching material(s) caused by the patterning or etching described above.

Figure 4:
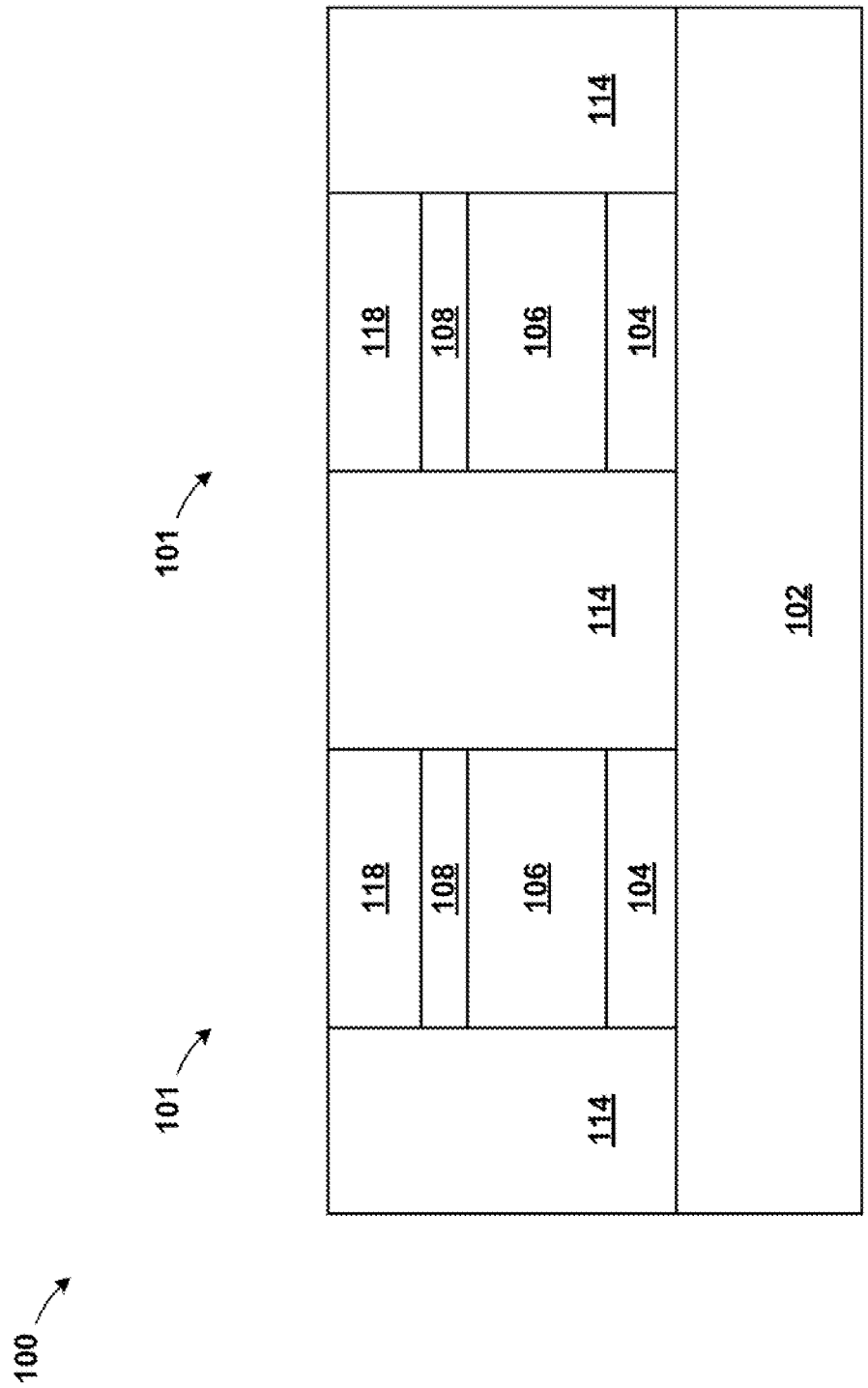
FIG. 4 illustrates a cross-sectional view of the semiconductor structure illustrating forming a switching layer, according to an exemplary embodiment.

Referring now to FIG. 4, the structure 100 is shown after forming a switching layer 118 in the opening 116, in accordance with an embodiment. The switching layer 118 may be deposited using typical deposition techniques, for example, a physical vapor deposition process with collimation, ionized-physical vapor deposition, chemical vapor deposition and atomic layer deposition.

According embodiments of the present invention, the switching layer 118 may be made from a chalcogenide, or a chemical compound including at least one chalcogen anion and at least one or more electropositive elements. For example, the switching layer 118 may be made from tellurium (Te), sulfur (S), or selenium (Se). In a specific example the switching layer 118 may be made of tellurium-arsonic-germanium-silicon-selenium (TeAsGeSiSe). In an alternate example, the switching layer 118 may be made of germanium-antimony-selenium-nitrogen (Ge—Sb—Se—N). The switching layer 118 may operate as a switch for the cell 101. The material of the switching layer 118 may be an ovonic threshold switch, which is a glass switch which, after being brought from the highly resistive state to the conducting state, returns to the highly resistive state when current falls below a holding current value.

In general, the switching layer 118 is deposited such that it fills the opening 116 as shown in FIG. 3, and in most cases excess material is deposited outside of the opening 116 on an upper surface of the first dielectric layer 114. After deposition of the switching layer 118, a chemical mechanical planarization technique can be used to polish the excess material of the switching layer 118, exposing the upper surface of the first dielectric layer 114, and provide a substantially smooth and uniform surface. After polishing, upper surfaces of the switching layer 118 and the first dielectric layer 144 will be substantially flush. It is noted that the first buffer layer 108 physically separates the phase change material layer 106 from the switching layer 118, thereby preventing any migration of the phase change material layer 106 into the switching layer 118 during operation.

Figure 5:
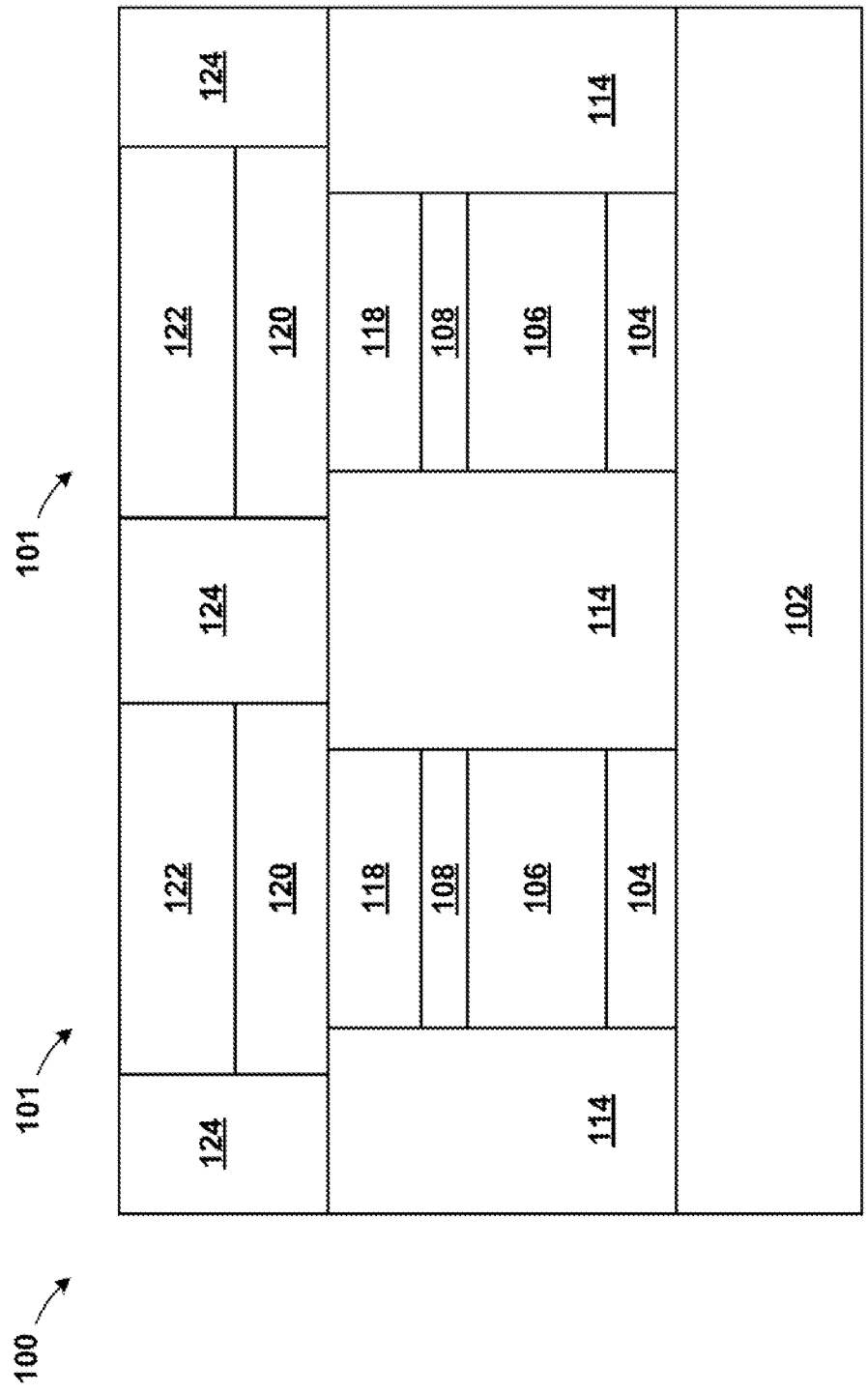
FIG. 5 illustrates a cross-sectional view of the semiconductor structure illustrating forming a buffer layer and a top electrode, according to an exemplary embodiment.

Referring now to FIG. 5, the structure 100 is shown after a second buffer layer 120, a top electrode 122, and a second dielectric layer 124 are formed, in accordance with an embodiment.

The second buffer layer 120 may be blanket deposited on top of the structure 100, directly on top of the switching layer 118 and the first dielectric layer 114. Similar to the first buffer layer 108, the second buffer layer 120 may include any suitable barrier material known in the art, such as titanium nitride (TiN), tantalum nitride (TaN), cobalt, ruthenium, carbon (C), titanium carbide (TiC), tantalum carbide (TaC), titanium aluminium nitride (TiAlN), tantalum aluminium nitride (TaAlN), titanium aluminium carbide (TiAlC), tantalum aluminium carbon (TaAlC), hafnium nitride (HfN) or tungsten nitride (WN) either alone or in combination with other suitable barrier material. In an embodiment, the second buffer layer 120 is made from the same barrier material as the first buffer layer 108. In an alternate embodiment, the second buffer layer 120 is made from a different barrier material than the first buffer layer 108.

According to the present embodiment, the second buffer layer 120 acts as a barrier, physically separating the switching layer 118 from the top electrode 122 formed thereon. In an embodiment, the first buffer layer 108 may have a thickness ranging from about 1 nm to about 30 nm, although a thickness less than 1 nm and greater than 30 nm may be acceptable.

The top electrode 122 may be blanket deposited on top of the structure 100, and directly on a top surface of the second buffer layer 120. Similar to the bottom electrode 104, the top electrode 122 may be formed from a conductive material layer, such as, for example, copper, tungsten, cobalt, or aluminum. The conductive material layer of the top electrode 122 may be deposited using typical deposition techniques, for example, atomic layer deposition, molecular layer deposition, and chemical vapor deposition. In an embodiment, the top electrode 122 may have a thickness ranging from about 10 nm to about 100 nm, although a thickness less than 10 nm and greater than 100 nm may be acceptable.

Figure 6:
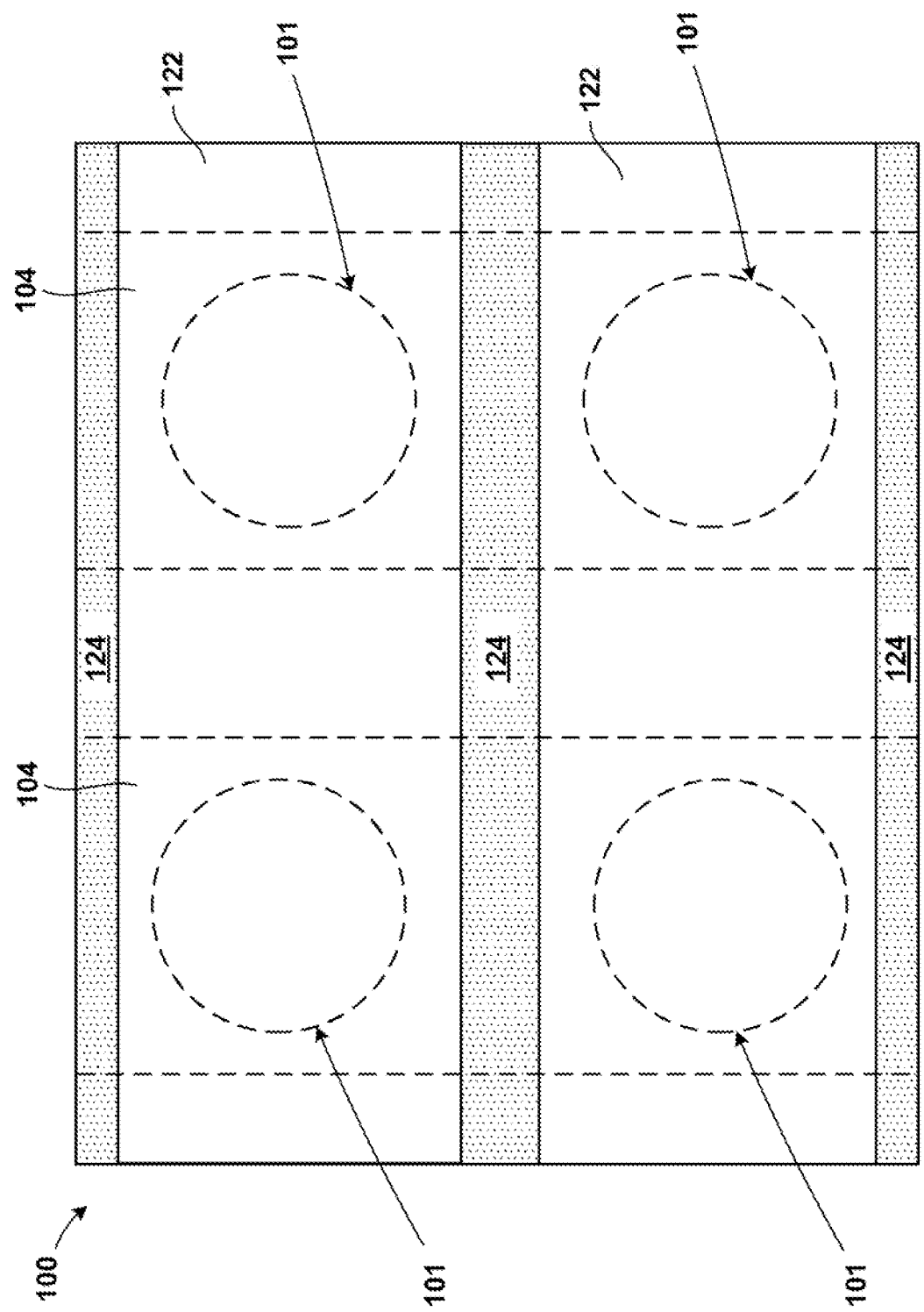
FIG. 6 illustrates a top view of the semiconductor structure, according to an exemplary embodiment.

After the aforementioned layers and materials are formed or deposited, the top electrode 122 and the second buffer layer 120 may be patterned into rows extending from cell to cell, as depicted in FIG. 6. The rows can be formed using patterning techniques known in the art. More specifically, portions of the conductive material layer of the top electrode 122 and the second buffer layer 120 may be selectively removed using an anisotropic etching technique, such as, for example, reactive ion etching. Preferably, an upper surface of the first dielectric layer 114 is exposed as a result of patterning the aforementioned layers. Although the exact dimensions are not critical, it is critical that the rows completely cover the underlying switching layer 118. More particularly, it is critical that the second buffer layer 120 be larger, or wider, than the switching layer 118 in order to provide the intended physical barrier between the switching layer 118 and the second electrode 122.

The second dielectric layer 124 can be deposited across the top of the structure 100 in a blanket layer using any known deposition techniques, such as, for example, chemical vapor deposition, atomic layer deposition, physical layer deposition, or some combination thereof. More specifically, the second dielectric layer 124 may be deposited within and generally fill the spaces between adjacent rows. For example, the second dielectric layer 124 may be deposited directly on top of the exposed surfaces of the first dielectric layer 114 between adjacent portions of the second buffer layer 120 and the top electrode 122. Similar to the first dielectric layer 114, the second dielectric layer 124 may include materials, such as, for example, an oxide, a nitride, or some combination thereof. In an embodiment, the second dielectric layer 124 may include an oxide, such as, silicon oxide. In an alternate embodiment, the second dielectric layer 124 may include a nitride, such as, silicon nitride. A chemical mechanical planarization technique may optionally be used to polish the second dielectric layer 124, expose the top electrode 122 and provide a substantially smooth and uniform surface in preparation for subsequent processing techniques.

It should be noted that the second buffer layer 120 and the top electrode 122 do not have to be deposited sequentially and then patterned simultaneously, as described above. Instead, persons of ordinary skill in the art could apply know fabrication techniques to produce structures or layers similar to the second buffer layer 120 and the top electrode 122 described above.

The cell 101 is a phase change memory cell with an ovonic threshold switch in series. The ovonic threshold switch (the switching layer 118) is formed directly on top of the phase change memory cell (the phase change material layer 106), in a pillar configuration.

The phase change material layer 106 may store two different memory states due to differences in resistivity between the phase change material layer 106 crystalline phase which is a low resistive state, and the amorphous phase which is a high resistive state. Once the switching layer 118 operating as a switching device is turned on, current may flow between the bottom electrode 104 and the top electrode 122 allowing for the current to pass through the phase change material layer 106, the first buffer layer 108, the switching layer 118, the second buffer layer 120 to the top electrode 122. Differences in a resulting current, due to the phase change material layer 106 being in either the low resistive state or the high resistive state, allow for determination of one of the two different memory states. The first buffer layer 108 may prevent migration of the phase change material layer 106 into the switching layer 118.

The switching layer 118 may operate as a switching device when a voltage across the top electrode 122 and the bottom electrode 104 exceeds a threshold voltage of the switching layer 118, turning the switching device on, allowing a reading of a memory state to be determined of the phase change material layer 106. When the voltage across the top electrode 122 and the bottom electrode 104 is below the threshold voltage of the switching layer 118, the switching device returns to a high impedance, off, state, turning the cell 101 off.

An ovonic threshold switch in series with the phase change memory cell may be difficult to manufacture as the ovonic threshold materials may be easily oxidized or damaged in many settings including subsequent processing steps after formation of a layer of ovonic threshold material.

Process steps to build the phase change memory cell with an ovonic threshold switch may occur in a different order than traditional phase change memory cell to protect the ovonic threshold switch material from damage, in particular damage during processing step of reactive ion etching. A second buffer layer may be used to protect the phase change material layer with uniform composition and to protect it during processing of the phase change memory cell with an ovonic threshold switch.

The switching layer 118 or ovonic threshold switch is formed at a later processing step of fabrication of the cell 101 compared to other phase change memory cells with an ovonic threshold switch, and is formed after formation of the phase change material layer 106, resulting in less subsequent process steps until the final structure is complete. Specifically, the switching layer 118 is formed after the multiple deposition steps and reactive ion etching steps used to form the bottom electrode 104, the phase change material layer 106, the first buffer layer 108 and the first dielectric layer 114, thus avoiding possible damage to the ovonic threshold switch material during these process steps.

The additional buffer layer of the second buffer layer 120 formed over the switching layer 118 helps prevent damage to the ovonic threshold switch materials caused by typical etching techniques. The second buffer layer 120 provides a barrier protecting the switching layer 118 during the anisotropic etching of the top electrode 122 and the second buffer layer 120. Forming the second buffer layer 120 wider than the switching layer 118 further helps to insulate the switching layer 118, where the second buffer layer 120 overlaps side surfaces of the second buffer later and covers a portion of the first dielectric layer 114 between adjacent cells 101.

The switching layer 118 is protected by the first buffer layer 108 below the switching layer 118, by the second buffer layer 120 above the switching layer 118 and by the first dielectric layer 114 surrounding sides of the switching layer 118.

The resulting phase change memory cell with an ovonic threshold switch increases memory cell density as the memory cell switch is built into onto a single footprint including both the memory cell and the switch for the memory cell.

The resulting phase change memory cell with the switching layer 118 may be manufactured with a smaller critical dimension than, such as, for example, 4 nm, compared to a memory cell with an OTS material layer formed at an earlier stage of manufacturing, due to the eliminated etch and process damage of the switching layer 118 from process steps performed after formation of the switching layer 118.

According to an alternative embodiment, the phase change material layer 106 may alternatively include a material suitable for an alternative type of non-volatile memory cell such as resistive random access memory (ReRAM), conductive bridging random access memory (CBRAM) or ferroelectric tunnel junction (FTJ). For ReRAM, metal oxides, such as hafnium oxide, tantalum oxide, titanium oxide, aluminum oxide, silicon oxide, are typically used and oxygen vacancies in the oxide serve as building block of switching filament. For CBRAM, metal cations, such as copper, silver, and mixture thereof are used instead of oxygen vacancies. For FTJ, hafnium based ferroelectric films are used for the switching layer, for example hafnium oxide and hafnium oxide with dopants such as aluminum, zirconium, silicon, nitrogen, etc.

Referring now to FIG. 6, a top view of the structure 100 is shown, in accordance with an embodiment. The structure 100 includes four cells 101, which may be part of a memory array.

The memory array includes word lines and bit lines orthogonally arranged using connected top electrodes 122 and connected bottom electrodes 104. An upper horizontal surface of the cell 101 may be substantially circular when viewed from above and is shown with dashed lines below horizontal connecting lines of the top electrodes 122, as viewed from above. The bottom electrodes 104 of the four cells 101, shown as dashed lines, may be connected in vertical lines, as viewed from above. The second dielectric layer 124 is shown between the connecting lines of the top electrodes 122. The connected bottom electrodes 104 and the connected top electrodes 122 may be reversely connected and each may function as either a word line or as a bit line when arranged as a crosspoint array. Alternatively, connected bottom electrodes 104 and connected top electrodes may each be a word line or a bit line dependent upon wiring of the memory array.

In principle, if a crosspoint array is not specifying wordline and bitline, it is not necessarily to limit our claims such that bottom electrodes have to connect bit line and top electrodes have to connect to word line. Is it possible to rephrase it and also include the case that is reversely connected (i.e., it is also ok to say BE to WL and TE to BL depends on wiring of WL and BL)

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
a bottom electrode on a substrate;
a phase change material layer above the bottom electrode;
a first buffer layer above the phase change material layer;
an ovonic threshold switching layer above the first buffer layer, wherein vertical sidewalls of the bottom electrode, the phase change material layer, the first buffer layer, and the ovonic threshold switching layer are aligned with one another;
a second buffer layer above the ovonic threshold switching layer, wherein a width of the second buffer layer is greater than a width of the ovonic threshold switching layer.

2. The structure according to claim 1, further comprising:
a top electrode above the second buffer layer, the second buffer layer physically separating the ovonic threshold switching layer and the top electrode.

3. The structure according to claim 2, wherein a width of the ovonic threshold switching layer is less than a width of the top electrode.

4. The structure according to claim 1, wherein a width of the ovonic threshold switching layer is equal to a width of the phase change material layer.

5. The structure according to claim 1, further comprising:
a dielectric surrounding the bottom electrode, the phase change material layer, and the ovonic threshold switching layer, wherein a portion of the second buffer layer covers an upper horizontal portion of the dielectric.

6. The structure according to claim 2, wherein a width of the phase change material layer is less than a width of the top electrode.

7. The structure according to claim 2, further comprising:
an array of structures, wherein the structures are wired together forming word lines and bit lines.

8. A structure comprising:
a bottom electrode on a substrate;
a phase change material layer above the bottom electrode;
an ovonic threshold switching layer above the phase change material layer, wherein vertical sidewalls of the bottom electrode and the phase change material layer are aligned with one another; and
a first buffer layer above the ovonic threshold switching layer, wherein a width of the first buffer layer is greater than a width of the ovonic threshold switching layer.

9. The structure according to claim 8, further comprising:
a top electrode above the first buffer layer, the first buffer layer physically separating the ovonic threshold switching layer and the top electrode, wherein a width of the ovonic threshold switching layer is less than a width of the top electrode.

10. The structure according to claim 9, wherein a width of the phase change material layer is less than a width of the top electrode.

11. The structure according to claim 8, further comprising:
a dielectric surrounding the bottom electrode, the phase change material layer, and the ovonic threshold switching layer, wherein a portion of the first buffer layer covers an upper horizontal portion of the dielectric.

12. The structure according to claim 8, further comprising:
a second buffer layer, the second buffer layer physically separating the ovonic threshold switching layer and the phase change material layer.

13. The structure according to claim 8, further comprising:
an array of structures, wherein the structures are wired together forming word lines and bit lines.

14. A structure comprising:
a bottom electrode on a substrate;
a phase change material layer above the bottom electrode;
a first buffer layer above the phase change material layer;
an ovonic threshold switching layer above the first buffer layer, wherein vertical sidewalls of the bottom electrode, the phase change material layer, the first buffer layer, and the ovonic threshold switching layer are aligned with one another; and
a second buffer layer above the ovonic threshold switching layer, wherein a width of the second buffer layer is greater than a width of the ovonic threshold switching layer, wherein the second buffer layer covers a an upper horizontal portion of a first dielectric surrounding the phase change material layer, the first buffer layer and the ovonic threshold switching layer.

15. The structure according to claim 14, further comprising:
a top electrode aligned above the second buffer layer, the second buffer layer physically separating the ovonic threshold switching layer and the top electrode.

16. The structure according to claim 15, wherein
a width of the ovonic threshold switching layer is less than a width of the top electrode.

17. The structure according to claim 15, wherein
a horizontal width of the phase change material layer is less than a horizontal width of the top electrode.

18. The structure according to claim 14, further comprising:
an array of structures, wherein the structures are wired together forming word lines and bit lines.

* * * * *